(12) United States Patent
Jain

(10) Patent No.: US 7,557,021 B2
(45) Date of Patent: Jul. 7, 2009

(54) HIGHLY DOPED GATE ELECTRODE MADE BY RAPIDLY MELTING AND RESOLIDIFYING THE GATE ELECTRODE

(75) Inventor: Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 338 days.

(21) Appl. No.: 11/175,682

(22) Filed: Jul. 6, 2005

(65) Prior Publication Data
US 2007/0020900 A1 Jan. 25, 2007

(51) Int. Cl.
*H01L 21/265* (2006.01)
(52) U.S. Cl. ............... 438/519; 438/518; 257/E21.615
(58) Field of Classification Search ............... 438/518, 438/519, 523, 543, 550
See application file for complete search history.

(56) References Cited

U.S. PATENT DOCUMENTS 5,966,605 A * 10/1999 Ishida .................. 438/299
6,100,171 A * 8/2000 Ishida .................. 438/535
6,200,866 B1 * 3/2001 Ma et al. ................ 438/299
2003/0008450 A1 * 1/2003 Tsai et al. .............. 438/200

OTHER PUBLICATIONS

Wong et al., "Elimination of Poly-Si Gate Depletion for Sub-65-nm CMOS Technologies by Excimer Laser Annealing", Apr. 2005, IEEE electron Device Letters, vol. 26, No. 4, pp. 234-236.*
Jain, patent application for Source/Drain Extensions Having Highly Activated and Extremely Abrupt Junctions, filed Sep. 30, 2004.
Jain, et al, patent application for Source/Drain Extension Implant Process for Use With Short Time Anneals, U.S. Appl. No. 10/842,308, filed May 10, 2004.

* cited by examiner

*Primary Examiner*—Alexander G Ghyka
*Assistant Examiner*—Reema Patel
(74) *Attorney, Agent, or Firm*—Wade J. Brady, III; Frederick J. Telecky, Jr.

(57) ABSTRACT

The present invention provides, in one embodiment, a method for fabricating a microelectronic device. The method comprises implanting a dopant into a gate electrode located on a substrate. The gate electrode has a melting point below a melting point of the substrate. The method also comprises melting the gate electrode to allow the dopant to diffuse throughout the gate electrode. The method further comprises re-solidifying the gate electrode to increase dopant-occupied substitutional sites within the gate electrode.

12 Claims, 5 Drawing Sheets

HIGHLY DOPED GATE ELECTRODE MADE BY RAPIDLY MELTING AND RESOLIDIFYING THE GATE ELECTRODE

TECHNICAL FIELD OF THE INVENTION

The present invention is directed in general to the manufacture of a microelectronic device and, more specifically, to the fabrication of a gate for the microelectronic device.

BACKGROUND OF THE INVENTION

There is a continuing push to produce smaller microelectronic devices with lower power consumption and faster switching speeds. With device miniaturization, however, comes a number of new design problems. In particular, as new technologies are implemented to produce smaller device components, there is a need to retain compatibility with other components still being produced by older technologies. Consider, for instance, efforts to scale-down microelectronic devices such as metal oxide semiconductor (MOS) transistors.

Scaling down the thickness of the transistor's gate dielectric advantageously produces a higher electric field in the channel for a given applied gate voltage, which in turn produces a higher on-state current. Ideally, when the transistor is biased to create channel inversion, the gate has sufficient numbers of dopants to allow the electric field lines to end at the interface between the gate and gate dielectric.

Unfortunately, gates comprising semiconductor material, such as doped polysilicon, are manufactured with a limited number of dopants at this interface. Consequently, when the transistor is biased to invert the channel, the gate is depleted of majority carriers for a certain distance into the gate. Depletion causes an increase in the effective thickness of the gate dielectric, termed the electrical thickness, which in turn deteriorates the performance characteristics of the transistor. For example, an electrical thickness that is as little as 10 percent greater than the physical thickness of the gate dielectric can significantly reduced the strength of the electric field in the channel, thereby reducing the drive current and switching speed of the transistor. The impact of this problem on transistor performance is exacerbated as gate thicknesses are decreased with each technology node.

Metal gates are an attractive alternative to polysilicon gate because metals have a larger supply of charge than doped polysilicon. When a metal gate is inverted, there is no substantial electric field penetration at the interface between the metal gate and gate dielectric. Accordingly, the transistor's performance is not deteriorated because the electrical thickness of the gate dielectric is not increased. The integration of semiconductor transistors having metal gates has been troublesome, however.

It has proven challenging to simply deposit and etch metals to form gate structures. It is also difficult to find etchants and etching conditions where gate metals can be selectively etched without damaging the underlying gate dielectric and substrate. Metal gate deposit-and-etch fabrication schemes are further complicated if two different metals are used to provide dual work function gates. Using a single metal having midrange work function results in gate electrodes with an undesirably high threshold voltage.

Therefore there is need for an improved method to manufacture thin gate layers having a large supply of charge while avoiding the above-mentioned limitations.

SUMMARY OF THE INVENTION

To address the above-discussed deficiencies of the prior art, the present invention provides a method for fabricating a microelectronic device. The method comprises implanting a dopant into a gate electrode located on a substrate. The gate electrode has a melting point below the melting point of the substrate. The method also comprises melting the gate electrode to allow the dopant to diffuse throughout the gate electrode. The method also comprises re-solidifying the gate electrode, to increase dopant occupied substitutional sites within the gate electrode.

In another embodiment, the present invention provides a metal oxide semiconductor (MOS) device. The MOS device comprises a gate dielectric layer on a substrate and a gate electrode on the gate dielectric layer. The gate electrode comprises at least about 1.5 times more dopant-occupied substitutional sites than an equivalent equilibrium solid-state gate electrode.

Yet another embodiment of the present invention is a method of manufacturing an integrated circuit. The method comprises forming a microelectronic device using the above-described method. The method further comprises interconnecting metal lines on one or more insulating layers located over the microelectronic device and interconnecting the microelectronic device to form an operative integrated circuit.

The foregoing has outlined preferred and alternative features of the present invention so that those of ordinary skill in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the scope of the invention.

BRIEF DESCRIPTION OF THE DRAWINGS

The invention is best understood from the following detailed description when read with the accompanying Figures. It is emphasized that in accordance with the standard practice in the semiconductor industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention benefits from the realization that the concentration of majority carriers in a gate made of semiconductor material can be dramatically increased by rapidly melting and re-solidifying the gate during the gate's fabrication. It is recognized that the maximum concentration of majority carriers is governed by the concentration of dopants that can be incorporated into substitutional sites present in the semiconductor gate. The term substitutional site as used herein refers to locations of host atoms in regular lattice sites of the semiconductor that are replaced by a foreign atom such as an implanted dopant atom. It is further recognized as part of the present invention, that the concentration of dopants that can provide majority carriers is increased by increasing the occupation of substitutional sites in the semiconductor.

While not limiting the scope of the present invention by theory, it is believed that melting and re-solidifying the gate material according to the present invention produces a gate with a larger number of substitutional sites than that found in a equilibrium solid-state gate. The term equilibrium solid-state gate as used herein refers to a gate formed under diffusion and nucleation conditions that provide low-energy highly stable lattice structure. An equilibrium solid-state gate has a limited number of substitutional sites that can be occupied by implanted dopants.

This is in contrast to the gate electrode of the present invention, which is rapidly melted and re-solidified. It is thought that melting facilitates the rapid diffusion of dopant atoms while not damaging other microelectronic device components. It is further believed that rapid re-solidification promotes formation of a high-energy lattice with a meta-stable structure and consequently, high number of dopant occupied substitutional sites.

One embodiment of the present invention is presented in FIGS. 1 to 4, which illustrate cross-sectional views of selected steps in an exemplary method for fabricating a microelectronic device 100 according to the principles of the present invention. Embodiments of the microelectronic device 100 comprise gate-containing devices such as a transistor device. Non-limiting examples comprise MOS semiconductor devices including p-type channel Metal Oxide Semiconductor (pMOS) and n-type channel Metal Oxide Semiconductor (nMOS) field effect transistors. Embodiments of the microelectronic device 100 also comprise combinations of transistor device, such as complementary metal oxide semiconductor (CMOS) devices.

Figure 1:
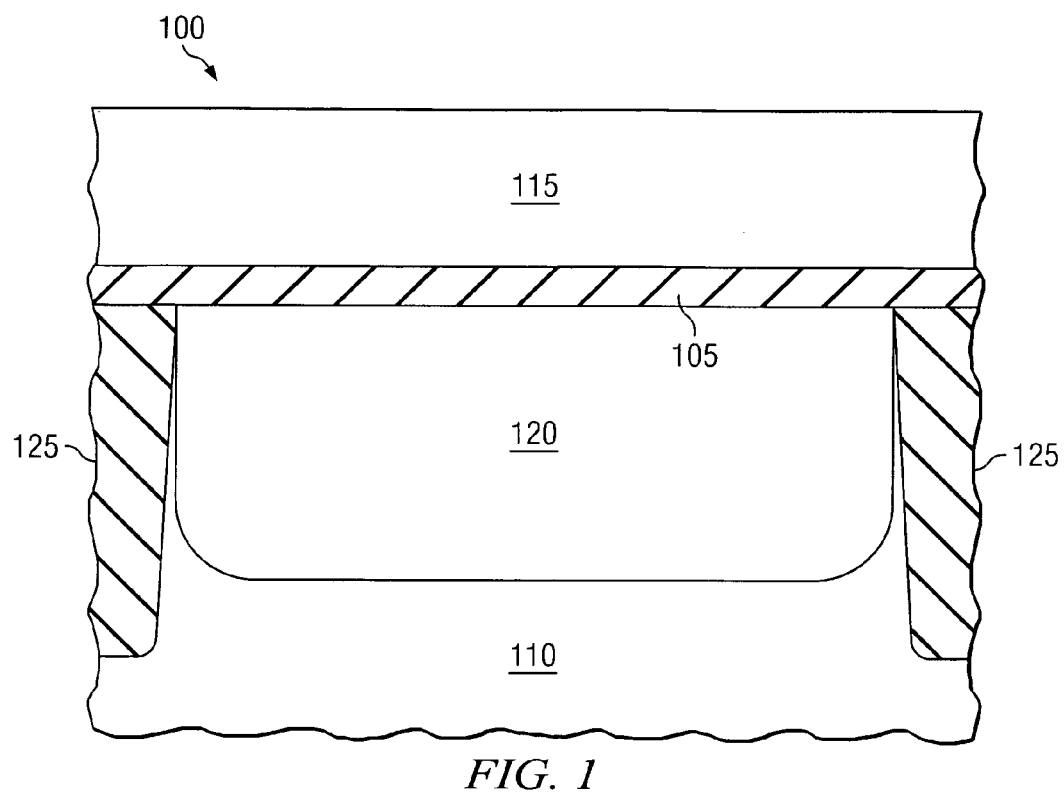
FIGS. 1 to 4 illustrate cross-sectional views of selected steps in a process for fabricating a microelectronic device according to the principles of the present invention.

Turning first to FIG. 1, depicted is the exemplary partial completed microelectronic device 100 after forming a gate dielectric layer 105 on a substrate 110, and a gate layer 115 on the dielectric layer 105 and over the substrate 110. The substrate 110 can be conventionally formed and comprise conventional semiconducting materials, and more preferably silicon. In some embodiments, the gate dielectric layer 105 comprises a dielectric material, using conventional procedures such as silicon dioxide grown thermally. Suitable materials for the gate layer 115 include semiconductor materials such as polysilicon. Any conventional deposition process, including CVD, physical vapor deposition (PVD), atomic layer deposition (ALD), or combinations thereof, can be used to form the gate layer 115.

FIG. 1 shows the device 100 after also performing conventional procedures to form a doped well 120 and forming shallow trench isolation (STI) structures 125 in the substrate 110. An n-type well 120 is preferably a silicon substrate 110 doped with an n-type dopant, such as arsenic ($As^+$) or phosphorus ($P^+$). A p-type well 120 is preferably a silicon substrate 110 doped with a p-type dopant like boron ($B^+$). The shallow trench isolation (STI) structures 125 preferably comprise CVD deposited silicon oxide and serve to electrically isolate the device 100 from other adjacent devices formed in the substrate 110.

Figure 2:
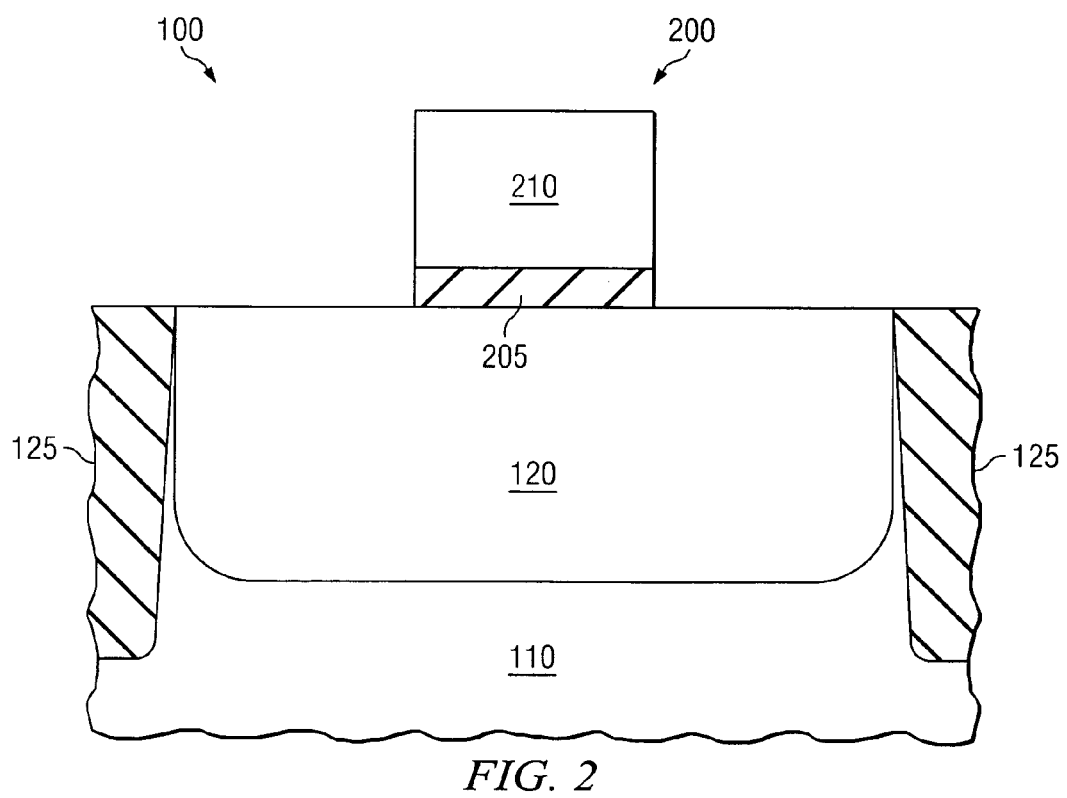

With continuing reference to FIG. 1, FIG. 2 illustrates the partially completed microelectronic device 100 after performing conventional photolithography techniques to pattern the gate dielectric layer 105 and gate layer 115 to form a gate 200. The gate 200 comprises a gate dielectric 205 and gate electrode 210.

To selectively melt the gate electrode 210, it is desirable for the gate layer 115 and therefore the gate electrode 210 to have a melting point that is less than the melting point of the substrate 110 that the gate electrode 210 is formed over. The term melting point as used herein refers to the temperature at which a material such as the gate layer 115 and therefore the gate electrode 210 undergoes a transition between a solid and liquid phase. For instance, in some cases it is desirable for the gate electrode 210 to comprise one or more metal or a metal alloy that has a melting point that is lower than the melting point of the silicon substrate 110. In the case where the substrate 110 comprises silicon, some preferred embodiments of the gate electrode 210 comprise germanium, and more preferably substantially pure germanium. Germanium has a melting point of about 900° C., which is lower than the melting point of crystalline silicon (about 1412° C.).

Other preferred embodiments of the gate electrode 210 comprise an alloy, and more preferably a silicon alloy, having a melting point that is lower than the melting point of silicon. It is desirable for one or more constituents in the metal alloy to impart a melting point that is lower than the melting point of the silicon substrate 110. In some preferred embodiments the constituent comprises germanium and the alloy is a germanium silicon alloy. In such instances, the silicon alloy will have a melting point that is between the melting point of the constituent and silicon.

It is desirable to have enough metal in the metal alloy of the gate electrode 210 to reduce the melting point of the gate electrode 210 by an amount sufficient to provide a processing window for selective melting of the gate electrode 210. Consider embodiments of the gate electrode 210 comprising a silicon germanium alloy. Preferably the silicon germanium alloy has at least about S atomic percent germanium and balance silicon. A germanium content of at least about 5 atomic percent is sufficient to reduce the melting point of the silicon germanium alloy to about 1360° C. or lower. This provides a gate electrode 210 having at least about 50° C. lower melting point than the silicon substrate 120, thereby providing a large enough processing window for selective gate electrode 140 melting.

Still other preferred embodiments of the gate electrode 210 comprise a silicon germanium alloy having at least about 20 atomic percent germanium and balance silicon. A germanium content of at least about 20 atomic percent reduces the melting point of the silicon germanium alloy to about 1310° C. or lower, thereby providing a gate electrode 210 having a melting point that is at least about 100° C. lower than the melting point of the substrate 120.

In yet other preferred embodiments, the metal alloy of the gate electrode 210 comprises a silicon germanium alloy having at least about 20 atomic percent silicon and balance germanium. A metal alloy comprising at least about 20 atomic percent silicon advantageously allows conventional silicon etch technologies to be used for patterning of the metal alloy to form the gate electrode 210.

Figure 3:
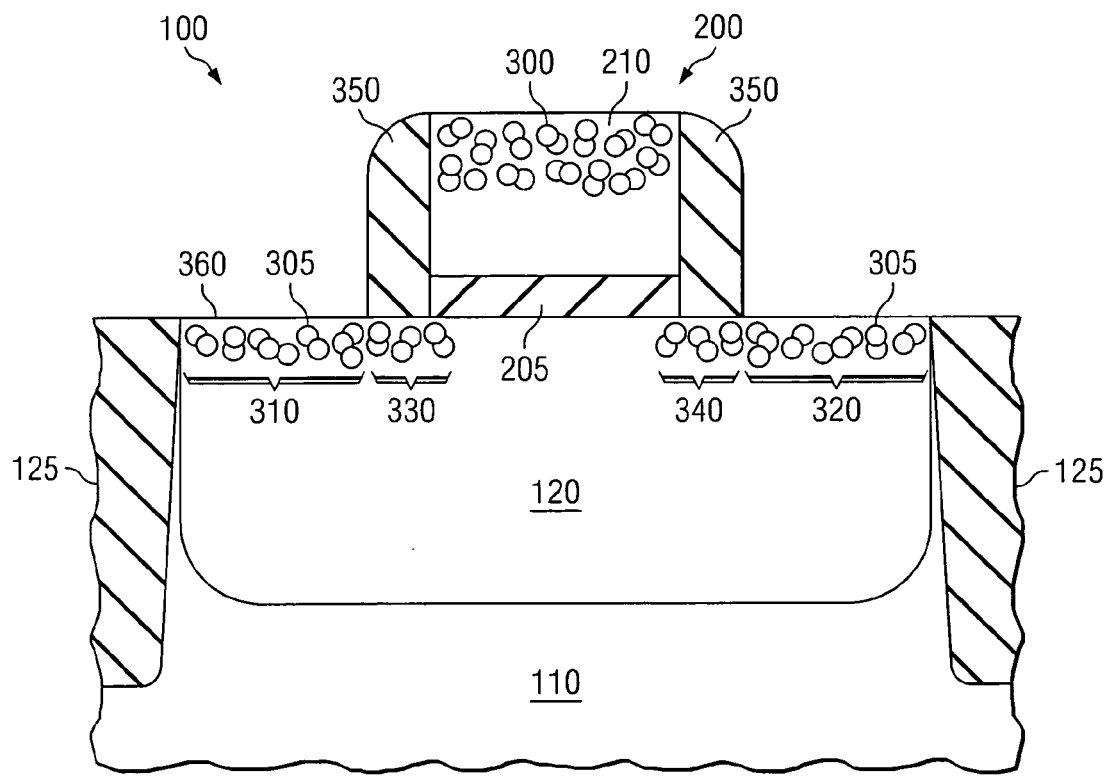

With continuing reference to FIGS. 1-2, FIG. 3 illustrates the partially completed microelectronic device 100 after implanting dopant 300 into the gate electrode 210. The dopant 200 comprises n-type or p-type dopants depending on whether the objective is to increase the concentration of majority carriers that are electrons or holes, respectively. For instance, n-type dopants are implanted to increase donor majority carrier for a nMOS device, while p-type dopants are implanted to increase acceptor majority carriers for a PMOS device.

In some preferred embodiments of the method, gate dopant 300 implantation is done concurrently with dopant 305 implantation for source and drain electrodes 310, 320 formation. In such instances the gate dopant 300 is substantially the same as the source/drain dopant 305. Of course, appropriate masking steps can be performed to implant different amounts or types of dopants 300 into the gate electrode 210 than the source/drain dopants 305, if desired.

In still other embodiments of the method the gate electrode 210 is implanted with dopants 300 at a stage in device fabrication that is separate from source/drain dopant 305 implantation. In some of these embodiments, for example, dopant 300 are implanted into the gate layer 115 prior to patterning to form the gate 200 and therefore before source/drain dopant 305 implantation. Of course in such instances it is still desirable to pattern the gate layer 115 to form the gate 200 before source/drain dopant 305 implantation so that the gate electrode 210 and the STI structure 125 can serve as masks to define portions of the substrate 110 or well 120 that are implanted with the source/drain dopant 305.

The type of dopants 300, 305 that are implanted depends on the type of microelectronic device 100 being produced and its intended use. For example, embodiments of the microelectronic device 100 that comprise a pMOS transistor have source/drain dopants 305 comprising p-type dopants. Alternatively, a microelectronic device 100 comprising an nMOS transistor preferably have source/drain dopants 305 comprising n-type dopants. One of ordinary skill in the art would understand how to adjust the appropriate implantation doses of dopants 300, 305. One skilled in the art would also be familiar with the appropriate masking procedures to facilitate selective implantation of both p-type and n-type dopants 300, 305 into microelectronic devices 100 comprising nMOS and PMOS transistors.

In preferred embodiments of the method, source/drain dopant 305 implantation further comprises separate implantation steps for source/drain extensions 330, 340 and the source/drain 310, 320. Preferably, dopant implantation for the source/drain extensions 330, 340 is done before forming sidewall spacers 350 while implantation for the source/drain 210, 220 is done after forming the sidewall spacers 350 adjacent the gate 200. In cases where the gate dopant 300 and source/drain dopant 305 implantations are done concurrently, the gate 200 can be masked to control the exposure of the gate electrode 210 to source/drain dopants 305, if desired.

Implantation for source/drain extensions 330, 340 and source/drain 310, 320 formation can comprise single-step or multi-step dopant 305 implantation protocols. For instance, dopants 305 can be implanted with the dopant implantation source situated at angles normal or abnormal to the substrate's surface 360, or both. Dopants 305 can be implanted with the implantation source at a single or at multiple locations above the substrate 110, with a portion of the implantation done at each location. In some cases, it is desirable to perform a pre-amorphization implant to amorphize the substrate surface 360 before source/drain dopant 305 implantation. As well understood by those skilled in the art, an amorphized surface is one that has lost its crystallinity and become substantially disordered.

Figure 4:
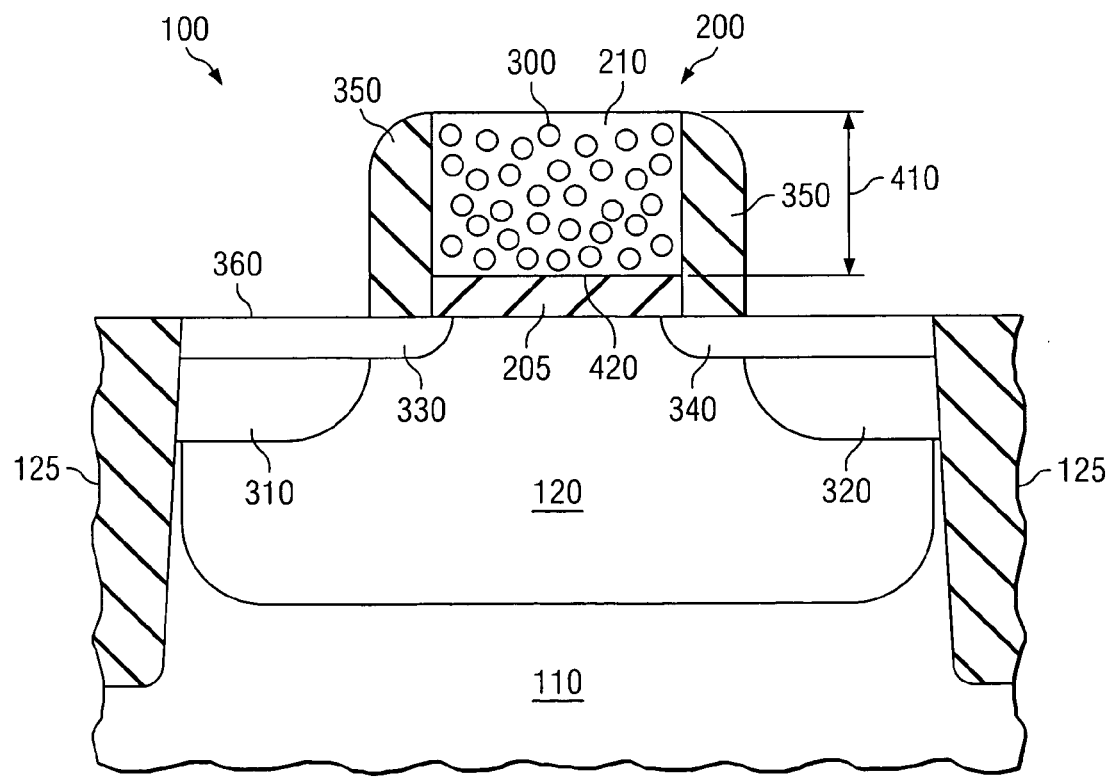

Turning now to FIG. 4, with continuing reference to FIGS. 1-3, illustrated is the partial completed microelectronic device 100 after melting and re-solidifying the gate electrode 210 to form a re-solidified gate electrode 210 with an increased number of dopant occupied substitutional sites. The term melting as used herein refers to increasing the temperature of a material to a temperature equal to or above its melting point. In some cases, melting and re-solidification is accomplished by melting and re-solidifying the gate layer 115 prior to its patterning to form the gate electrode 210. It is more efficient however to melt and re-solidify the gate electrode 210 because this eliminates the need for additional steps.

When melting the gate electrode 210 it is advantageous to have a structure surrounding the gate electrode 210 so as to confine the gate electrode when it is in a liquid state. In some cases the sidewall spacers 360 serve as a confining structure. Other cases where a separate confining structure is constructed around the gate electrode 210 are also within the scope of the invention. Of course in cases where melting and re-solidifying is done on the gate layer 115, a confining structure is not needed.

Melting is achieved by heating the gate electrode 210, to a temperature equal to or above its melting point. Re-solidification is achieved by allowing the gate electrode 210 to cool below its melting point. One of ordinary skill in the art would be familiar with the instrumentation and procedures to rapidly melt and re-solidifying the gate electrode 210. Non-limiting examples include the use of laser, flash lamp or other high power radiation.

As discussed above, melting allows the dopant 300 to diffuse throughout the gate electrode 210, while re-solidifying increases dopant occupied substitutional sites within the gate electrode 210. As also discussed above, to selectively melt the gate electrode 210, the gate electrode 210 is preferably composed of a material that has a melting point that is less than the melting point of the substrate 110. In certain preferred embodiments, such as when the substrate 110 comprises silicon, melting comprises heating the gate electrode 210 to a temperature ranging from about 1360° C. to about 900° C. for a time ranging from about 1 nanosecond to about 2 milliseconds. Melting preferably comprises heating the gate electrode 210 to a temperature that is at least about 50° C. lower than a melting point of a substrate 110.

For the purposes of characterizing the melting point of the gate electrode 210 relative to the substrate 110, the substrate 110 is considered to include any component parts of the device 100 already formed in or on the substrate 110 at the time the gate electrode 210 is melted. As an example, if the substrate 110 comprises crystalline silicon having a melting point of about 1412° C. then the melting point of the gate electrode 210 is less than about 1412° C. Preferably, the melting point of the gate electrode 210 is also less than the melting point of device components already formed in or on the substrate 110. Examples of such device components include the gate dielectric 205, doped well 120, STI structures 125, source/drain electrodes 310, 320, and source/drain extensions 330, 340, sidewall spacers 360 or other conventional device components.

In preferred embodiments of the method, melting and re-solidifying are both completed in a total time of less than about 2 milliseconds. It is undesirable to heat longer than about 2 milliseconds in some cases because longer periods can result in distortions in the substrate 110 and delamination of device components, in a process commonly known as slip. As an example heating within 100° C. the melting point of a silicon substrate 110 for more than 2 milliseconds can cause distortions in the substrate and delamination of STI structures 125 from the substrate 110.

In some preferred embodiments of the method the heating time ranges from about 100 microseconds to about 2 milliseconds. The lower limit of about 100 microseconds is preferred in instances where the heating to melt the gate electrode 210 also is used in the fabrication of other device components. For instances a heating time of at least about 100 microseconds is desirable to diffuse dopants 305 implanted into the source/drain electrodes 310, 320 and source/drain extensions 330, 340, as well as to anneal damage to the substrate 110 caused by implantation.

In other cases the heating time ranges from about 1 nanosecond to about 100 microseconds. This time range is preferred in instances where the heating substantially serves to melt the gate electrode 210 only. Heating times in this range also advantageously minimize the occurrence of slip. In such instances, a second heating protocol is done to diffuse source/drain dopants 305 and to anneal the damage to the substrate 110. One example of a suitable second heating protocol for this purpose is a spike thermal anneal comprising heating to about 1050° C. for about 1-2 seconds. In such embodiments the melting and re-solidifying of the gate electrode 210 can be performed at a later stage of device fabrication.

In some cases the lower limit for the time of heating depends upon the instrumentation selected to produce melting and the thickness 410 of the gate electrode 210. For instance heating times as short as about 100 microseconds can be achieved using a continuous wave laser or a flash lamp. Shorter heating times to about 1 nanosecond can be achieved using solid-state lasers, such as an yttrium-aluminum-garnet (YAG) laser.

To increase the number of majority carriers at the interface 420 between the gate dielectric 205 and the gate electrode 210, it is important for melting to be sufficiently long to allow the dopant 300 to diffuse to the interface. For some preferred gate electrode thicknesses 410 ranging from about 80 to about 100 nanometers a heating time of about 1 microsecond is sufficient to ensure full diffusion of the dopant 300 throughout the melted gate electrode 210 and to the interface 420. One skilled in the art would understand how to adjust the heating time to insure full uniform diffusion of dopant 300 throughout gate electrode 210 of different thicknesses 410.

Figure 5:
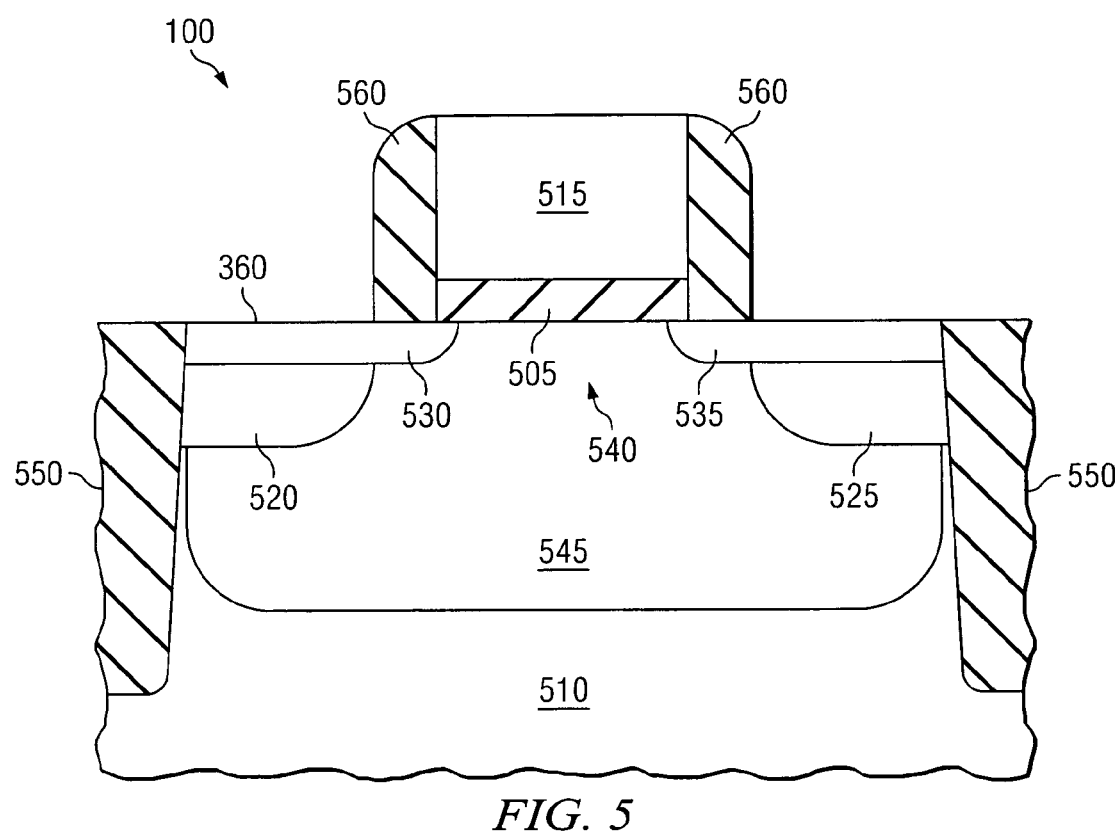
FIG. 5 illustrates a cross-sectional view of an exemplary metal oxide semiconductor (MOS) device of the present invention.

Another embodiment of the present invention is illustrated in FIG. 5, a metal oxide semiconductor (MOS) device 500. Any of the above-described embodiments of methods can be used to fabricate the MOS device 500. The MOS device 500 comprises a gate dielectric 505 on a substrate 510 and a gate electrode 515 on the gate dielectric 505. Preferred embodiments of the MOS device 500 comprise other conventional components to provide an operative device, such as source/drain electrode 520, 525, source/drain extensions 530, 535, channel 540, doped well 545, STI structure 550 and sidewall spacers 560. These and other components can be formed as described above, or using other conventional procedures well known to those skilled in the art.

Fabricating the gate electrode 515 by a process that comprises melting and re-solidifying according to the methods presented above imparts the gate electrode 515 with a substantially larger number of substitutional sites than hitherto obtainable. The larger number of substitutional sites beneficially reduces the extent of depletion of majority carriers at the interface between the gate dielectric 505 and gate electrode 515 when the channel 540 is inverted. In some preferred embodiments of the MOS device 500 the gate electrode 515 comprises at least about 1.5 times more dopant-occupied substitutional sites than an equivalent equilibrium solid-state gate electrode. More preferably, the gate electrode 515 comprises about 10 times more dopant-occupied substitutional sites than an equivalent equilibrium solid-state gate electrode.

Consider as an example, a CVD polysilicon deposited and n- or p-type doped gate electrode 515 formed over a silicon substrate 510. In some cases an equilibrium solid-state gate electrode is expected to have substitutional sites ranging from about $8 \times 10^{19}$ to about $7 \times 10^{20}$ atoms per cubic centimeter. One skilled in the art would be familiar with the procedures used to determine the number of substitutional sites in a gate electrode 515. For example, spreading resistance measurements may be employed. Melting and re-solidifying the gate electrode 515 according to methods of the present invention increases the number of substitutional sites range from about $1 \times 10^{20}$ to about $7 \times 10^{21}$ atoms per cubic centimeter, corresponding to an about 1.5 to 10 times increase. This is dramatic contrast to conventional annealing protocols that have limited effect on the number of substitutional sites in a gate electrode.

Figure 6:
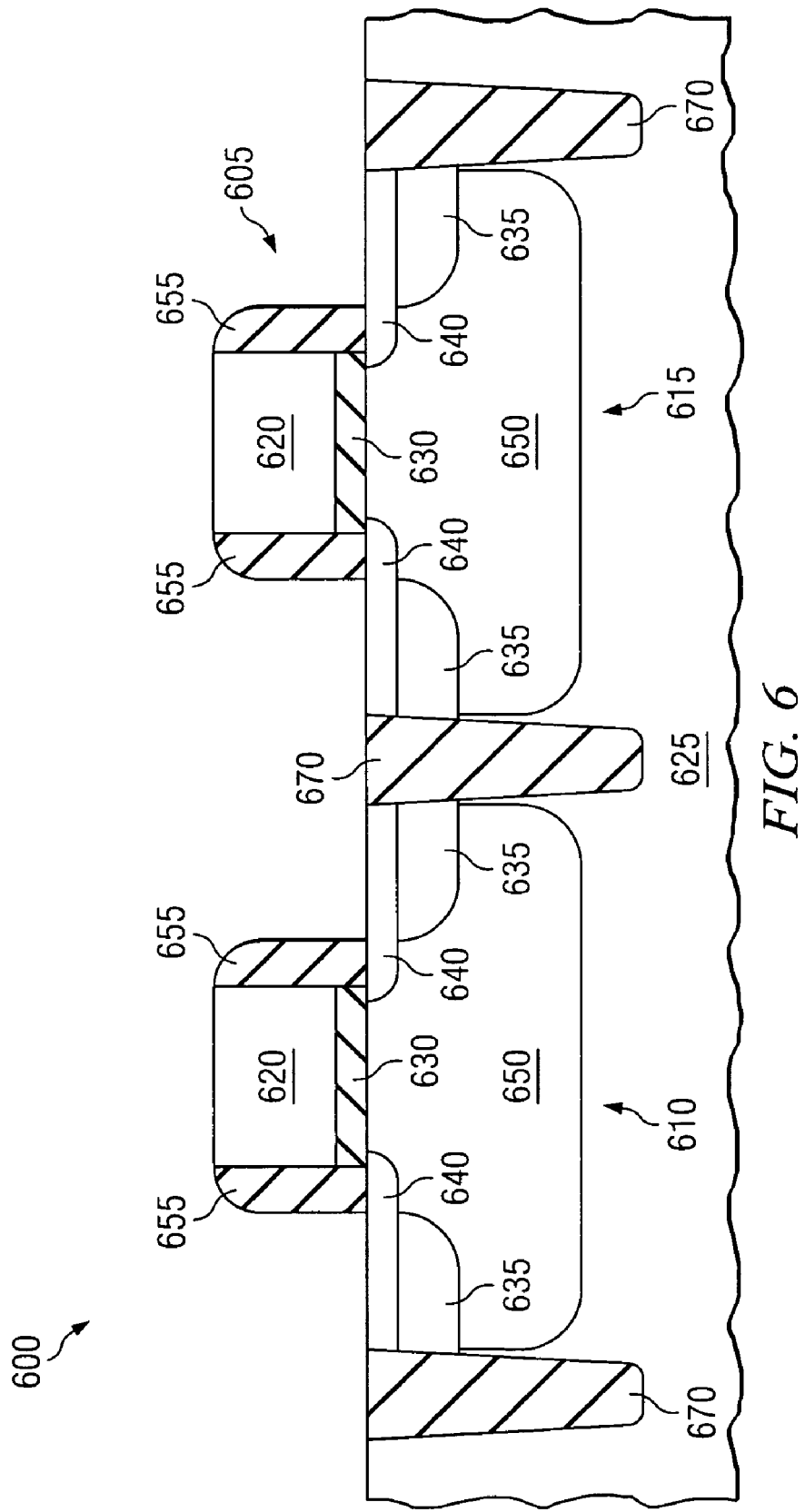
FIGS. 6 and 7 illustrate cross-sectional views of selected steps in a method of manufacturing an integrated circuit according to the principles of the present invention.
Figure 7:
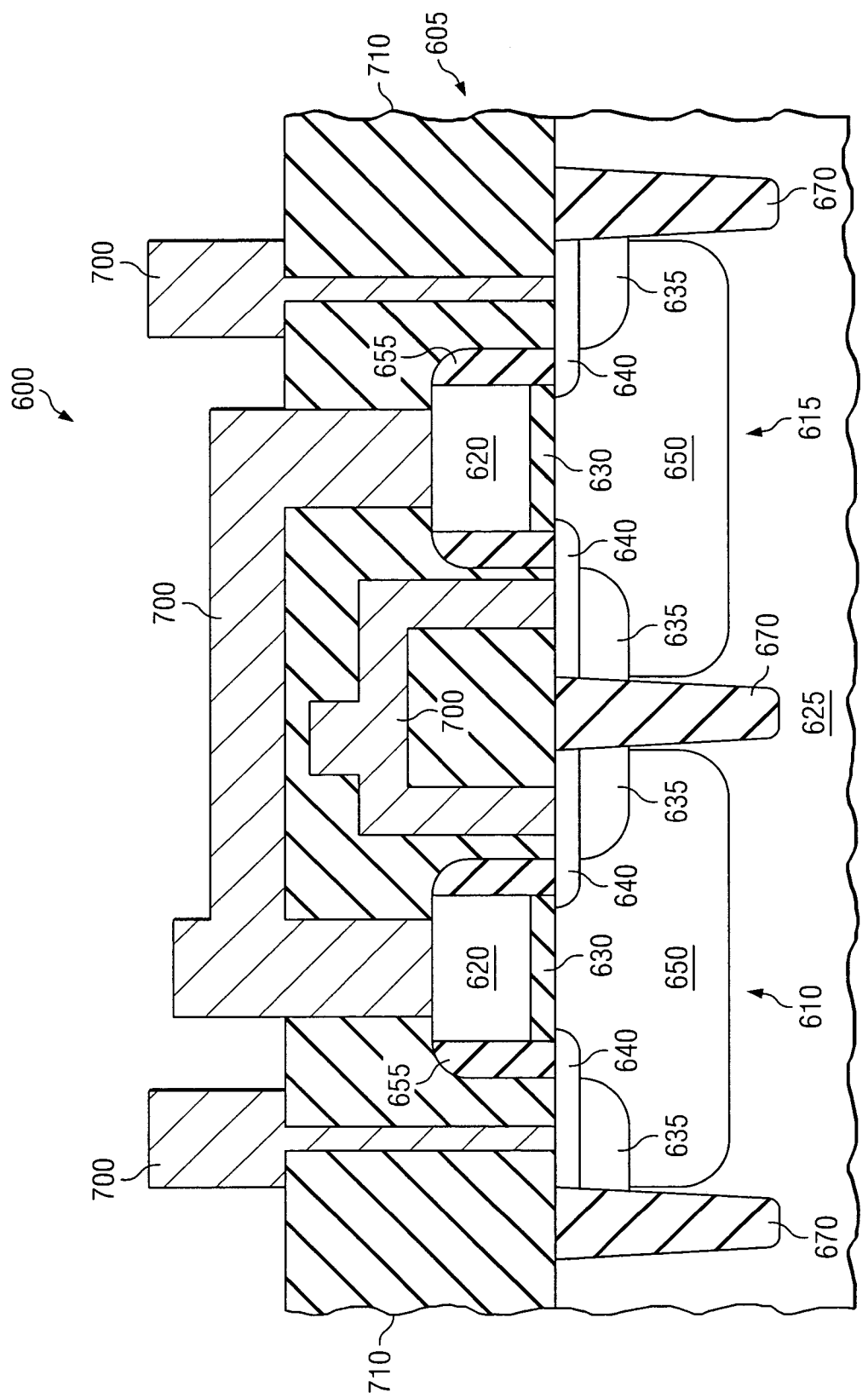

Another aspect of the present invention is a method of manufacturing an integrated circuit. FIGS. 6-7 illustrate cross-sectional views of selected stages in an exemplary method of manufacturing an integrated circuit 600.

Turning to FIG. 6, illustrated is the partially completed integrated circuit 600, after forming a microelectronic device 605. In some embodiments, the microelectronic device comprises PMOS and nMOS transistors 610, 615, respectively, in a CMOS device. The transistors 610, 615 can form part of logic, memory or other conventional integrated circuits 600.

Manufacturing of the microelectronic device 605 comprises implanting dopants into a gate electrode 620 located on a substrate 625. The gate electrode 620 has a melting point below a melting point of the substrate 625. The method further comprises melting the gate electrode 620 to allow the dopant to diffuse throughout the gate electrode 620 and re-solidifying the gate electrode, thereby increasing dopant-occupied substitutional sites within the gate electrode 620.

Any of the above-described embodiments of the method for fabricating a microelectronic device and the MOS device of the present invention, such as illustrated in FIGS. 1-5, can be used to form the microelectronic device 605. For instance, in some preferred embodiments the melting and re-solidifying are both completed in a total time of less than about 2 milliseconds. In other preferred embodiments the re-solidified gate electrode 620 has at least about 1.5 times more dopant occupied substitutional sites than a similarly doped equilibrium solid-state gate electrode. Of course, other components, such as a gate dielectrics 630, source/drain structures 635, source/drain extensions 640, wells 650, sidewall spacers 655 and shallow trench isolation structures 670 can be fabricated using process described above, or by other conventional processes.

Turning to now to FIG. 7, illustrated is the integrated circuit 600 after interconnecting metal lines 700 on one or more insulating layer 710 located over the microelectronic device 605 and interconnecting the microelectronic device 605 to form an operative integrated circuit 600.

Although the present invention has been described in detail, one of ordinary skill in the art should understand that they could make various changes, substitutions and alterations herein without departing from the scope of the invention.

What is claimed is:

1. A method for fabricating a microelectronic device, comprising:
   implanting a dopant into a gate electrode located on a substrate, said gate electrode having a melting point below a melting point of said substrate;
   melting said gate electrode to allow said dopant to diffuse throughout said gate electrode; and
   re-solidifying said gate electrode, to increase dopant occupied substitutional sites within said gate electrode, wherein the melting and the re-solidifying are performed after source/drain and source/drain extension implanting.

2. The method as recited in claim 1, wherein said melting comprises heating said gate electrode to a temperature that is at least about 50° C. lower than a melting point of said substrate.

3. The method as recited in claim 1, wherein said melting and said re-solidifying are both completed in a total time of less than about 2 milliseconds.

4. The method as recited in claim 1, wherein said substrate comprises silicon and said gate electrode comprises a metal having a melting point that is less than about 1412° C.

5. The method as recited in claim 1, wherein said gate electrode has a melting point that is at least about 50° C. lower than a melting point of said substrate.

6. The method as recited in claim 1, wherein said melting comprises heating said gate electrode to a temperature ranging from about 1360° C. to about 900° C. for a time ranging from 1 nanosecond to about 2 milliseconds.

7. The method as recited in claim 1, wherein said gate electrode comprises an alloy.

8. The method as recited in claim 7, wherein said alloy comprises a silicon germanium alloy having at least about 5 atom percent germanium.

9. The method as recited in claim 7, wherein said alloy comprises a silicon germanium alloy having at least about 20 atom percent silicon.

10. A method of manufacturing an integrated circuit comprising:
   forming a microelectronic device including:
      implanting dopants into a gate electrode located on a substrate, said gate electrode having a melting point below a melting point of said substrate;
      melting said gate electrode to allow said dopant to diffuse throughout said gate electrode; and
      re-solidifying said gate electrode, to increase dopant-occupied substitutional sites within said gate electrode, wherein the melting and the re-solidifying are performed after source/drain and source/drain extension implanting; and
   interconnecting metal lines on one of more insulating layers located over said microelectronic device and interconnecting said microelectronic device to form an operative integrated circuit.

11. The method as recited in claim 10, wherein said re-solidified gate electrode has at least about 1.5 times more dopant occupied substitutional sites than a similarly doped equilibrium solid-state gate electrode.

12. The method as recited in claim 10, wherein said melting and said re-solidifying are both completed in a total time of less than about 2 milliseconds.

* * * * *